(12) United States Patent
Kumar et al.

(10) Patent No.: US 9,754,646 B1
(45) Date of Patent: Sep. 5, 2017

(54) VOLTAGE STRESS TOLERANT HIGH SPEED MEMORY DRIVER HAVING FLYING CAPACITOR CIRCUIT

(71) Applicant: Cadence Design Systems, Inc., San Jose, CA (US)

(72) Inventors: Vinod Kumar, Pratapgarh (IN); Tara Vishin, Patparganj (IN); Sachin Ramesh Gugwad, Hubli (IN); Thomas Evan Wilson, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/342,974

(22) Filed: Nov. 3, 2016

(51) Int. Cl.
*G11C 7/12* (2006.01)
*G11C 7/10* (2006.01)
*G11C 7/22* (2006.01)

(52) U.S. Cl.
CPC ............. *G11C 7/12* (2013.01); *G11C 7/1012* (2013.01); *G11C 7/1084* (2013.01); *G11C 7/22* (2013.01)

(58) Field of Classification Search
CPC ........... G11C 7/12; G11C 7/22; G11C 7/1012; G11C 7/1084
See application file for complete search history.

(56) References Cited

U.S. PATENT DOCUMENTS

| | | | | |
|---|---|---|---|---|
| 7,046,067 B2 * | 5/2006 | Chung | ............. | H03K 19/00315 327/112 |
| 7,705,625 B2 * | 4/2010 | Yoo | ..................... | G11C 11/4074 326/26 |
| 8,536,925 B2 * | 9/2013 | Bhattacharya | ....... | H03K 3/0375 327/112 |
| 8,610,462 B1 * | 12/2013 | Wang | ............... | H03K 3/356113 326/68 |

* cited by examiner

*Primary Examiner* — Tri Hoang
(74) *Attorney, Agent, or Firm* — Schwegman Lundberg & Woessner, P.A.

(57) ABSTRACT

Embodiments relate to circuits, electronic design automation (EDA) circuit layouts, systems, methods, and computer readable media to enable logic devices operating on a core supply voltage to drive memory devices operating on a different supply voltage using low power and high data rates while avoiding voltage over-stress of thin-oxide transistors. In an embodiment, channels of a thin-oxide PMOS transistor, a thick-oxide PMOS transistor, a thick-oxide NMOS transistor, and a thin-oxide NMOS transistor are coupled in order from a memory device voltage supply rail to a low voltage supply rail. Gates of the thin-oxide PMOS transistor and the thick-oxide NMOS transistor are coupled with an output of a flying capacitor circuit that level-shifts an input signal by a difference between the memory device supply and core supply voltages, while gates of the thick-oxide PMOS transistor and the thin-oxide NMOS transistor receive the input signal via a buffer.

19 Claims, 6 Drawing Sheets

VOLTAGE STRESS TOLERANT HIGH SPEED MEMORY DRIVER HAVING FLYING CAPACITOR CIRCUIT

TECHNICAL FIELD

The subject matter disclosed herein relates to electronic circuits.

BACKGROUND

A typical computing machine is implemented with a microprocessor, memory, and a number of other modules depending on the function to be performed by the computing machine. Double data rate (DDR) random access memory (RAM) is a particular type of RAM commonly used in current technology that performs two read accesses or two write accesses per clock cycle. Both microprocessors and DDR RAM operate on various different power supply voltages. Memory driver circuits, also referred to as I/O driver circuits, can be used to allow for compatible communication between the microprocessors and DDR RAM chips.

Electronic design automation (EDA) is a category of systems for assisting with the design of electronic systems and devices. Large, integrated circuit designs are often assembled from previously designed blocks. This enables reduced turnaround times for generation of an integrated circuit. Schematic and layout information for such block portions of a design may be exchanged or licensed as intellectual property.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
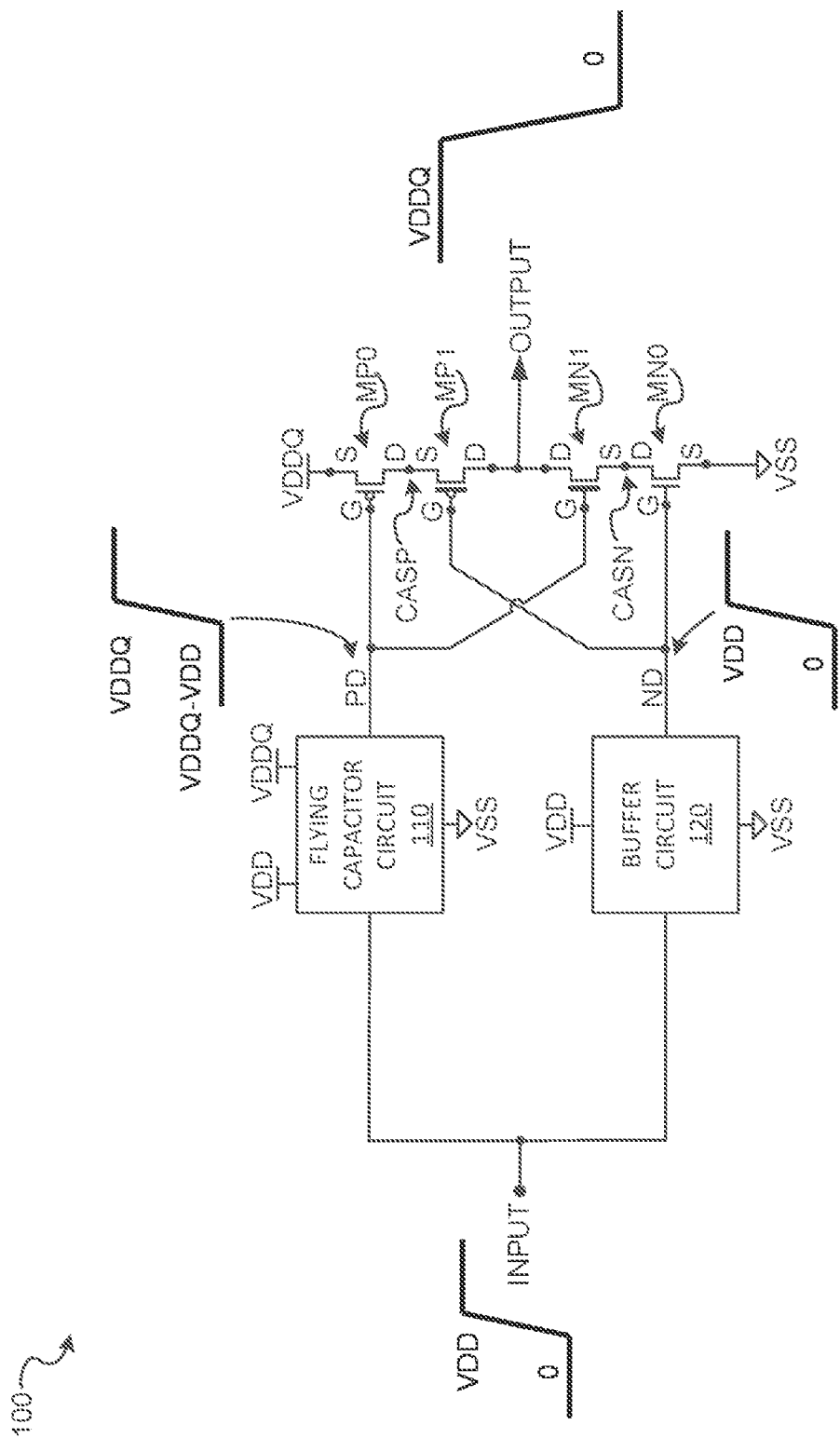
FIG. 1 is a circuit diagram illustrating a memory driver circuit including a flying capacitor circuit, according to some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Embodiments described herein relate to electronic design automation (EDA), and to systems, methods, devices, and instructions for generation of circuit design files. Some embodiments pertain to voltage stress tolerant high speed computer memory driver circuits that include flying capacitor circuits. The devices illustrated in the drawings may be implemented with metal oxide semiconductor (MOS) devices, for example, complementary MOS (CMOS) devices including n-type MOS (NMOS) devices and/or p-type MOS (PMOS) devices. While materials identified by the terms "metal" and "oxide" be present in, for example, a MOS field effect transistor (MOSFET), MOS transistors may have gates made out of materials other than metals, such as polysilicon, and may have dielectric regions made from dielectrics other than silicon oxide, e.g., a high-k dielectric. In various embodiments, the devices illustrated in the drawings may be implemented using other devices on silicon, compound semiconductor, or any other suitable semiconductor.

By including a pair of thick-oxide PMOS and NMOS transistors disposed between a pair of thin-oxide PMOS and NMOS transistors having their channels communicatively coupled with one another, and by cross-coupling gates of the pair of thick-oxide PMOS and NMOS transistors with gates of the pair of thin-oxide PMOS and NMOS transistors such that the gates of the thick-oxide PMOS and thin-oxide NMOS transistors are coupled together while the gates of the thick-oxide NMOS and thin-oxide PMOS transistors are coupled together, these enhanced techniques significantly improve protection of the pair of thin-oxide PMOS and NMOS transistors against voltage stress, compared to traditional techniques.

The following description and the drawings illustrate specific embodiments to enable those skilled in the art to practice them. Other embodiments may incorporate structural, logical, electrical, process, and other changes. Portions and features of some embodiments may be included in, or substituted for, those of other embodiments. Elements of the embodiments described herein are intended to cover all available equivalents of the elements described.

Without limitation, the disclosed exemplary embodiments are described in the context of industry standard computer memory systems. While the systems and methods involved in these example embodiments may find particular application in computer memory systems, this should not be construed as limiting, as the systems and methods described herein may equally well find application in other systems and methods involving electronic circuits for driving data lines and busses.

Memory driver circuits based on a conventional cross-coupled level shifter circuit can suffer performance issues, particularly in integrated circuit fabrication technologies where the threshold voltage Vth of thick-oxide semiconductor devices is high. In these memory driver circuits, most of the buffering stages operate on a same power supply, e.g., a power supply rail having voltage designated VDDQ, as the output stage (e.g., I/O) of the driver circuit and therefore contribute to more switching current from the VDDQ supply. Because a voltage level of the VDDQ supply is higher than a voltage level of a power supply rail having a voltage designated VDD of a core circuit providing input to the memory driver circuit, the higher amount of switching current from the VDDQ supply leads to higher power consumption by the memory driver circuit. In addition, a larger amount of switching current from the VDDQ supply adds more noise on the VDDQ supply, and therefore additional decoupling capacitors may be used to compensate for the additional noise on the VDDQ supply. These factors limit the ability to achieve competitive power, performance, and area (PPA) specifications by the memory driver circuits based on the conventional cross-coupled level shifter in manufacturing technologies where the Vth of thick-oxide semiconductor devices is high because most of the switching stages a these memory driver circuits operate on the VDDQ supply.

Architectures for memory driver circuits based on a flying capacitor circuit instead of the conventional cross-coupled level shifter circuit can avoid these issues discussed above with respect to the memory driver circuits based on a conventional cross-coupled level shifter circuit. However, the reliability of thin-oxide devices used in memory driver circuits based on the flying capacitor circuit at the VDD to VDDQ interface can be an issue in the architectures for memory driver circuits based on a flying capacitor circuit. Embodiments of a memory driver circuit based on a flying capacitor circuit discussed herein resolve the issue of reliability of thin-oxide devices by limiting the voltage across the thin-oxide semiconductor devices so that it does not cross the thin-oxide device tolerance limit.

FIG. 1 is a circuit diagram illustrating a memory driver circuit 100 including a flying capacitor circuit 110, according to some embodiments. A sample waveform propagating from an input node INPUT to an output node OUTPUT is also illustrated at various nodes of the memory driver circuit 100. The output signal at the memory driver circuit 100 output node OUTPUT may represent a logic value that is an inverse of the logic value of the input signal at the memory driver circuit input node INPUT.

The memory driver circuit 100 includes a thin-oxide PMOS transistor MP0, a thick-oxide PMOS transistor MP1, a thick-oxide NMOS transistor MN1, and a thin-oxide NMOS transistor MN0 arranged with their channels communicatively coupled in order from a high-voltage power supply rail VDDQ to a power supply rail having a low voltage designated VSS. Gates of the thin-oxide PMOS transistor MP0 and the thick-oxide NMOS transistor MN1 may be communicatively coupled with an output node PD of the flying capacitor circuit 110, while gates of the thick-oxide PMOS transistor MP1 and the thin-oxide NMOS transistor MN0 may be communicatively coupled with an output node ND of a buffer circuit 120. The gates of the thick-oxide devices may thus be cross-coupled with the gates of the thin-oxide devices.

Because the buffer circuit 120 is configured to buffer an input signal received from the input node INPUT to present at the node ND after a predetermined time delay, the gates of the thick-oxide PMOS transistor MP1 and the thin-oxide NMOS transistor MN0 may also be communicatively coupled with the input node INPUT via the buffer circuit 120. The predetermined time delay of the buffer circuit 120 may be equivalent to a signal delay of the flying capacitor circuit 110 so that the level-shifted signal at the node PD is about synchronized with the buffered signal at the node ND. The signals at the nodes PD and ND may be considered to be about synchronized when their rise and fall edges are within a nominal time window a each other such that the output of the memory driver circuit 100 does not have significant glitches and artifacts due to misalignment of the signals between the PD and ND nodes.

The power supply rail VDDQ may have a voltage level designated VDDQ. A power supply rail VDD may have a voltage level designated VDD. The voltage level VDD may be lower than the voltage level VDDQ. The power supply rail VDDQ may be used to drive a memory data line or bus external to a core circuit providing input to the memory driver circuit 100, and the power supply rail VDD may be used to power the core circuit. The power supply rail VSS may have a low voltage level designated VSS, ground, or zero volts. The voltage levels VDDQ and VDD may both designate a logic high value, while the voltage level VSS, ground, or zero volts may designate a logic low value.

The thin-oxide PMOS transistor MP0 may have a source S communicatively coupled with the power supply rail VDDQ and a gate communicatively coupled with a node PD at an output of the flying capacitor circuit 110. The thick-oxide PMOS transistor MP1 may have a source S communicatively coupled with a drain D of the thin-oxide PMOS transistor MP0 at a node CASP, a drain D communicatively coupled with an output node OUTPUT, and a gate G communicatively coupled with a node ND at an output of the buffer circuit 120. An input node of the buffer circuit 120 may be communicatively coupled with the input node INPUT, while the output node ND of the buffer circuit 120 may be communicatively coupled with the input node INPUT via the buffer circuit 120, and therefore the gate G of the thick-oxide PMOS transistor MP1 and the gate G of the thin-oxide NMOS transistor MN0 may be communicatively coupled with the input node INPUT via the buffer circuit 120. The thin-oxide NMOS transistor MN0 may have a source S communicatively coupled with the power supply rail VSS and a gate G communicatively coupled with the node ND at an output of the buffer circuit 120 and the gate G of the thick-oxide PMOS transistor MP1. The thick-oxide NMOS transistor MN1 may have a source S communicatively coupled with a drain D of the thin-oxide NMOS transistor MN0 at a node CASN, a drain D communicatively coupled with the output node OUTPUT and the drain D of the thick-channel PMOS transistor MP1, and a gate G communicatively coupled with the node PD and the gate G of the thin-oxide PMOS transistor MP0.

The flying capacitor circuit 110 may be coupled between the power supply rail VDD, the power supply rail VDDQ, and the power supply rail VSS to convert a voltage range of an input signal at the input node INPUT from between the VSS voltage level and the VDD voltage level to a voltage range of an output signal at the flying capacitor circuit output node PD from between a VDDQ-VDD voltage level and the VDDQ voltage level. The flying capacitor circuit 110 thus may level-shift the input signal at the input node INPUT to a different voltage range before outputting the level-shifted signal to the node PD.

The physical characteristics of thin-oxide and thick-oxide NMOS and PMOS transistors may be dependent upon a manufacturing technology, or technology node, used to manufacture electronic circuits including the thin-oxide and thick-oxide NMOS and PMOS transistors. Each new technology node may decrease circuit sizes and dimensions while increasing circuit speed compared to the prior technology node. As the line width decreases in each new technology node, the oxide thicknesses of CMOS transistor devices may also decrease correspondingly. Thus, whether a semiconductor device is considered a thin-oxide device or a thick-oxide device is dependent upon the technology node in which the semiconductor device is manufactured and depends upon the relative thicknesses of the gate oxide in the thin-oxide device and the thick-oxide device. In various embodiments, a thick-oxide NMOS or PMOS transistor may have a gate oxide thickness greater than a thin-oxide NMOS or PMOS transistor in the same technology node, for example, by 10%, 15%, 20%, 25%, or some other number as appropriate in the technology node used to manufacture the memory driver circuit 100.

In the embodiments of the memory driver circuit 100, voltages on the gates of the thick-oxide transistors MP1 and MN1 change as the voltages at nodes ND and PD change, respectively, as illustrated in FIG. 1. These changes to the gate voltages of the thick-oxide transistors MP1 and MN1 may protect the thin-oxide transistors MP0 and MN0 from voltage stress dynamically aligned with data switching signals at nodes ND and PD.

When the input node INPUT is switched from a logic low (e.g., voltage level of VSS or 0V) to a logic high (e.g., voltage level of VDD), the output node OUTPUT may switch from a logic high (e.g., voltage level of VDDQ) to a logic low (e.g., voltage level of VSS or 0V), and the gate voltage of the PMOS thin-oxide transistor MP0 at node PD may switch from a voltage level of VDDQ-VDD to a voltage level of VDDQ. Meanwhile, the gate voltage of the NMOS thin-oxide transistor MN0 at node ND may switch from 0V to a voltage level of VDD. Consequently, the voltage at cascode node CASP≥VDD. Therefore, the voltage stress across the thin-oxide PMOS transistor MP0 can be expressed as VDDQ-CASP≤VDDQ-VDD. When the worst case voltage stress condition has VDDQmax=1.575V (e.g., in DRR3 mode) and VDDmin=0.675V (e.g., a 7 nm process technology node), the maximum voltage stress across the thin-oxide PMOS device MP0 can be expressed as VDDQ-CASP≤1.575V-0.675V or VDDQ-CASP≤0.9V. Meanwhile, the voltage stress across the thin-oxide NMOS transistor MN0 may be 0V because the output node OUTPUT is at a logic low value of 0V. Therefore, the embodiments of the memory driver circuit 100 may ensure that the voltage stresses across the thin-oxide transistors MP0 and MN0 stay within their reliability limits of less than 1.0V (e.g., 7 nm process technology node core devices have a voltage limit less than 1.0V.

When the input node INPUT is switched from a logic high (e.g., voltage level of VDD) to a logic low (e.g., voltage level of VSS or 0V), the output node OUTPUT may switch from a logic low (e.g., voltage level of VSS or 0V) to a logic high (e.g., voltage level of VDDQ), and the gate voltage of the PMOS thin-oxide transistor MP0 at node PD may switch from a voltage level of VDDQ to a voltage level of VDDQ-VDD. Meanwhile, the gate voltage of the NMOS thin-oxide transistor MN0 at node ND may switch from a voltage level of VDD to 0V. Consequently, the voltage at cascode node CASN≤VDDQ-VDD. Therefore, the voltage stress across the thin-oxide NMOS transistor MN0 can be expressed as CASN≤VDDQ-VDD. When the worst case voltage stress condition has VDDQmax=1.575V (e.g., in DDR3 mode) and VDDmin=0.675V (e.g., a 7 nm process technology node), the maximum voltage stress across the thin-oxide NMOS device MN0 can be expressed as CASN≤1.575V-0.675V or CASN≤0.9V. Meanwhile, the voltage stress across the thin-oxide PMOS transistor MP0 may be 0V because the output node OUTPUT is at a logic high value of VDDQ. Therefore, the embodiments of the memory driver circuit 100 may ensure that the voltage stresses across the thin-oxide transistors MP0 and MN0 stay within their reliability limits of less than 1.0V (e.g., 7 nm process technology node core devices have a voltage limit less than 1.0V).

The embodiments may offer better PPA in comparison with other solutions that use internal reference voltages in place of the cross-coupling of the gates of the thick-oxide transistors MP1 and MN1 with the nodes ND and PD of the embodiments. The embodiments of the memory driver circuit 100 may ensure reliability of the thin-oxide transistors MP0 and MN0 across a wide power supply rail VDDQ voltage range from 1.0V to 1.6V. By not using internal reference voltages within the memory driver circuit 100, there may be a reduction of DC power used by the memory driver circuit 100, a reduction of semiconductor area used by the memory driver circuit 100, and improved performance of the memory driver circuit 100 in comparison with other solutions that use internal reference voltages in place of the cross-coupling of the gates of the thick-oxide transistors MP1 and MN1 with the nodes ND and PD of the embodiments. For example, the embodiments of the memory driver circuit 100 may operate well through the data rate of 4266 Gbps used for the 4$^{th}$ generation low power double data rate (LPDDR4) synchronous dynamic random access (SDRAM) memory JEDEC standard published by the JEDEC Solid State Technology Association and beyond. The embodiments may help achieve competitive PPA for DDR I/O in process technology nodes where threshold voltages (Vth) thick-oxide devices are relatively high and have very small over-drive with respect to the voltage at which these thick-oxide devices are being used, e.g., a voltage of the power supply voltage rail VDDQ.

In the embodiments of the memory driver circuit 100, fewer stages draw power from the power supply voltage rail VDDQ than in other solutions based on different architectures, thereby reducing switching current from the power supply voltage rail VDDQ. The reduction in switching current from the power supply voltage rail VDDQ may reduce switching noise on the power supply voltage rail VDDQ, and therefore effectively reduce a size of decoupling capacitors used at the chip level in combination with the embodiments of the memory driver circuit 100 compared with other solutions based on different architectures.

Figure 2:
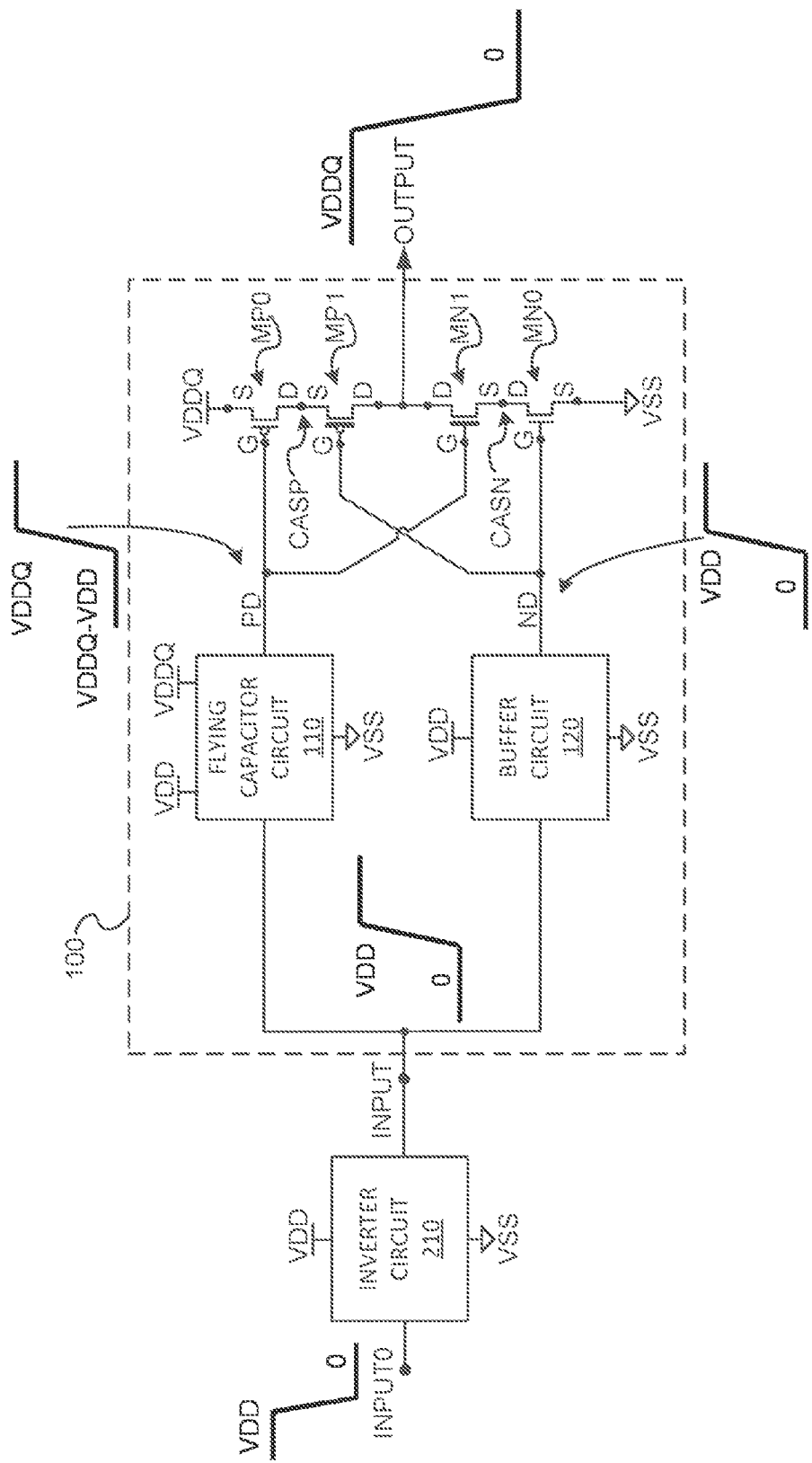
FIG. 2 is a circuit diagram illustrating the memory driver circuit of FIG. 1 following an inverter circuit, according to some embodiments.

FIG. 2 is a circuit diagram illustrating the memory driver circuit 100 of FIG. 1 following an inverter circuit 210, according to some embodiments. The inverter circuit 210 may have an output communicatively coupled with the input node INPUT of the memory driver circuit 100. The inverter circuit 210 may be coupled with the power supply rail VDD and the power supply rail VSS. The inverter circuit 210 may receive an input signal at an inverter input node INPUT0, invert the received input signal, and output an inverted input signal to the memory driver circuit 100 at an input node INPUT. The inverter circuit 210 may provide for the output signal at the memory driver circuit 100 output node OUTPUT to represent a same logic value as the input signal at the inverter circuit input node INPUT0.

Figure 3:
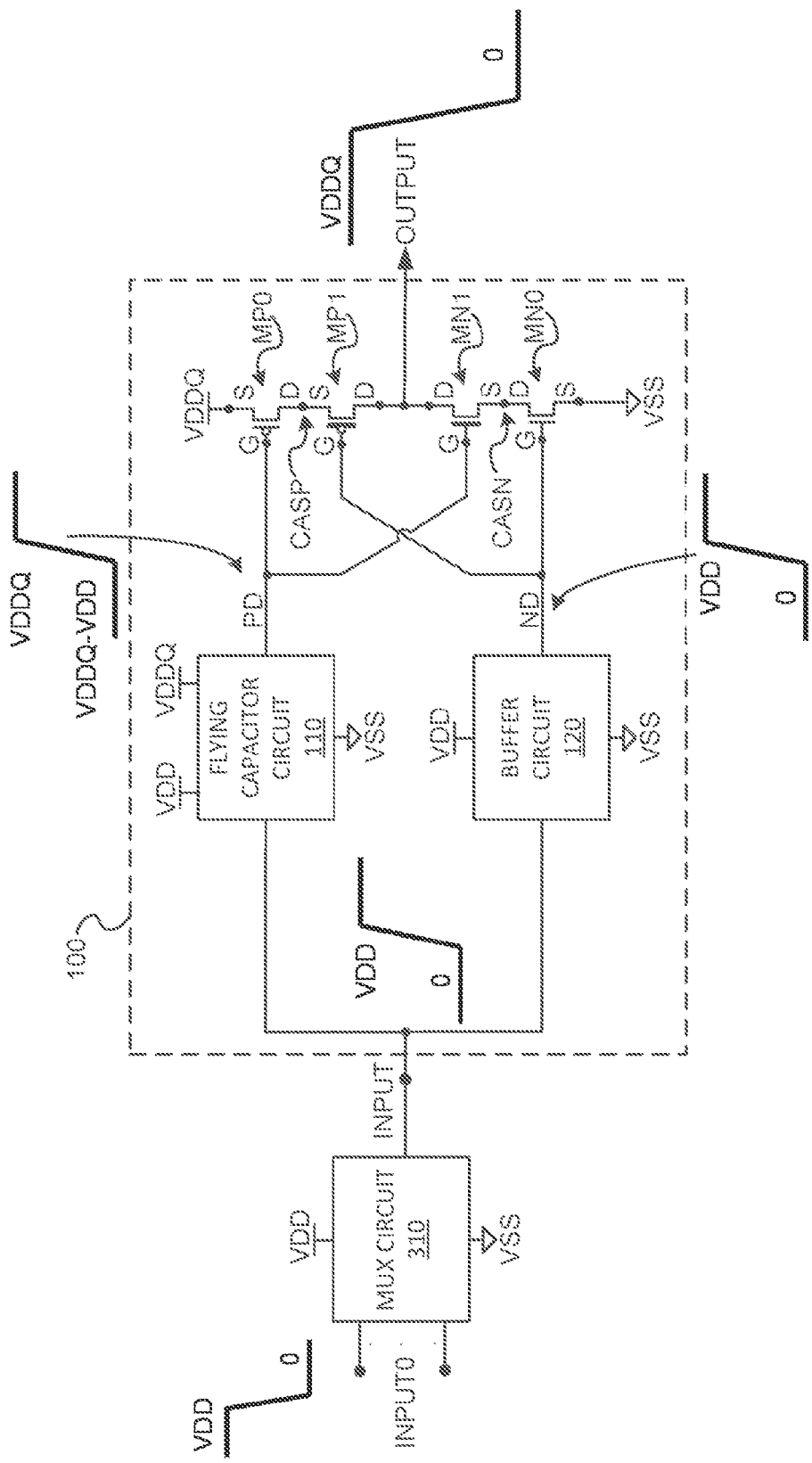
FIG. 3 is a circuit diagram illustrating the memory driver circuit of FIG. 1 following a multiplexer circuit, according to some embodiments.

FIG. 3 is a circuit diagram illustrating the memory driver circuit 100 of FIG. 1 following a multiplexer circuit 310, according to some embodiments. The multiplexer circuit 310 may have an output communicatively coupled with the input node INPUT of the memory driver circuit 100. The multiplexer circuit 310 may be coupled with the power supply rail VDD and the power supply rail VSS. The multiplexer circuit 310 may receive an input signal at a plurality of multiplexer input nodes INPUT0, multiplex the received input signals, and output a multiplexed input signal to the memory driver circuit 100 at a memory driver circuit input node INPUT.

In various embodiments, the multiplexer circuit 310 may also invert the received input signals at the plurality of multiplexer input nodes INPUT0 prior to outputting the multiplexed input signal to the memory driver circuit input node INPUT. Therefore, the multiplexer circuit 310 may also provide for the output signal at the memory driver circuit 100 output node OUTPUT to represent a same logic value as the input signals at the plurality of multiplexer circuit input nodes INPUT0 with different logic level values.

Figure 4:
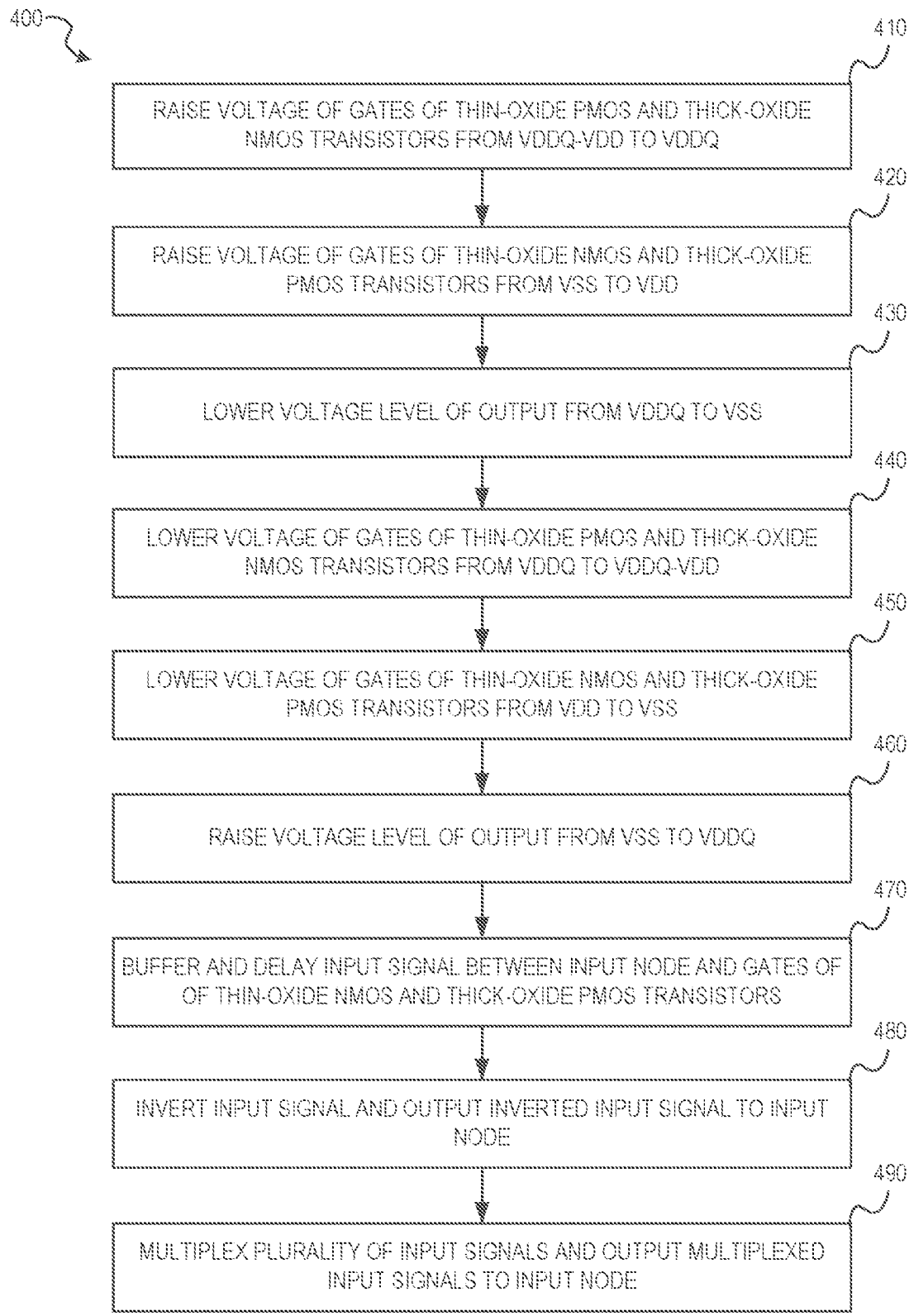
FIG. 4 is a flow chart illustrating a method of driving a computer memory by a memory driver circuit, according to some embodiments.

FIG. 4 is a flow chart illustrating a method 400 of driving a computer memory by a memory driver circuit 100, according to some embodiments. In an operation 410, as also illustrated in FIG. 1, a voltage level of the gate of the thin-oxide PMOS transistor MP0 and the gate of the thick-oxide NMOS transistor MN1 may be raised from a voltage level equivalent to the voltage level of the power supply rail VDDQ minus the voltage level of the power supply rail VDD, to the voltage level of the power supply rail VDDQ in response to an input voltage level at the input node INPUT rising from the voltage level of the power supply rail VSS to the voltage level of the power supply rail VDD. The voltage level of the gates of the thin-oxide PMOS transistor MP0 and the thick-oxide NMOS transistor MN1 may be level-shifted relative to the voltage level at the input node INPUT by the flying capacitor circuit 110.

In an operation 420, which may be performed simultaneously with operation 410, a voltage level of the gate of the thick-oxide PMOS transistor MP1 and the gate of the thin-oxide NMOS transistor MN0 may be raised from a voltage level of the power supply rail VSS to the voltage level of the power supply rail VDD in response to input voltage level at the input node INPUT rising from the voltage level of the power supply rail VSS to the voltage level of the power supply rail VDD. The voltage level of the gates of the thick-oxide PMOS transistor MP1 and the thin-oxide NMOS transistor MN0 may be set by the buffer circuit 120. The voltage level of the power supply rail VSS may be 0V.

In an operation 430, a voltage level of the output node OUTPUT may be lowered from the voltage level of the power supply rail VDDQ to the voltage level of the power supply rail VSS in response to the input voltage level at the input node INPUT rising from the voltage level of the power supply rail VSS to the voltage level of the power supply rail VDD. The voltage level of the output node OUTPUT may be set by the combined operation of the transistors MP0, MP1, MN1, and MN0, whose channels are communicatively coupled in order between the power supply rail VDDQ and the power supply rail VSS. The voltage level of the power supply rail VSS may be 0V.

In an operation 440, a voltage level of the gate of the thin-oxide PMOS transistor MP0 and the gate of the thick-oxide NMOS transistor MN1 may be lowered from the voltage level of the power supply rail VDDQ to the voltage level equivalent to the voltage level of the power supply rail VDDQ minus the voltage level of the power supply rail VDD, in response to the input voltage level at the input node INPUT lowering from the voltage level of the power supply rail VDD to the voltage level of the power supply rail VSS. The voltage level of the gates of the thin-oxide PMOS transistor MP0 and the thick-oxide NMOS transistor MN1 may be level-shifted relative to the voltage level at the input node INPUT by the flying capacitor circuit 110.

In an operation 450, which may be performed about simultaneously with operation 440, a voltage level of the gate of the thick-oxide PMOS transistor MP1 and the gate of the thin-oxide NMOS transistor MN0 may be lowered from a voltage level of the power supply rail VDD to the voltage level of the power supply rail VSS in response to the input voltage level at the input node INPUT lowering from the voltage level of the power supply rail VDD to the voltage level of the power supply rail VSS. The voltage level of the gates of the thick-oxide PMOS transistor MP1 and the thin-oxide NMOS transistor MN0 may be set by the buffer circuit 120.

In an operation 460, a voltage level of the output node OUTPUT may be raised from the voltage level of the power supply rail VSS to the voltage level of the power supply rail VDDQ in response to input voltage level at the input node INPUT lowering from the voltage level of the power supply rail VDD to the voltage level of the power supply rail VSS. The voltage level of the output node OUTPUT may be set by the combined operation of the transistors MP0, MP1, MN1, and MN0, whose channels are communicatively coupled in order between the power supply rail VDDQ and the power supply rail VSS.

In an operation 470, an input signal is buffered between the input node INPUT and the gates of the thick-oxide PMOS transistor MP1 and the thin-oxide NMOS transistor MN0 to delay the input signal by an amount equivalent to a signal delay of the flying capacitor circuit 110 between the input node INPUT and the gates of the thick-oxide NMOS transistor MN1 and the thin-oxide PMOS transistor MP0. The input signal may be buffered by the buffer circuit 120.

In an operation 480, an input signal INPUT0 may be inverted and output to the input node INPUT. In various embodiments, the input signal may be inverted by the inverter circuit 210 or by the multiplexer circuit 310.

In an operation 490, a plurality of input signals at input node INPUT0 of the multiplexer may be multiplexed and the multiplexed input signals may be output to the memory driver circuit input node INPUT by the multiplexer circuit 310 having an output communicatively coupled with the memory driver circuit input node INPUT.

Figure 5:
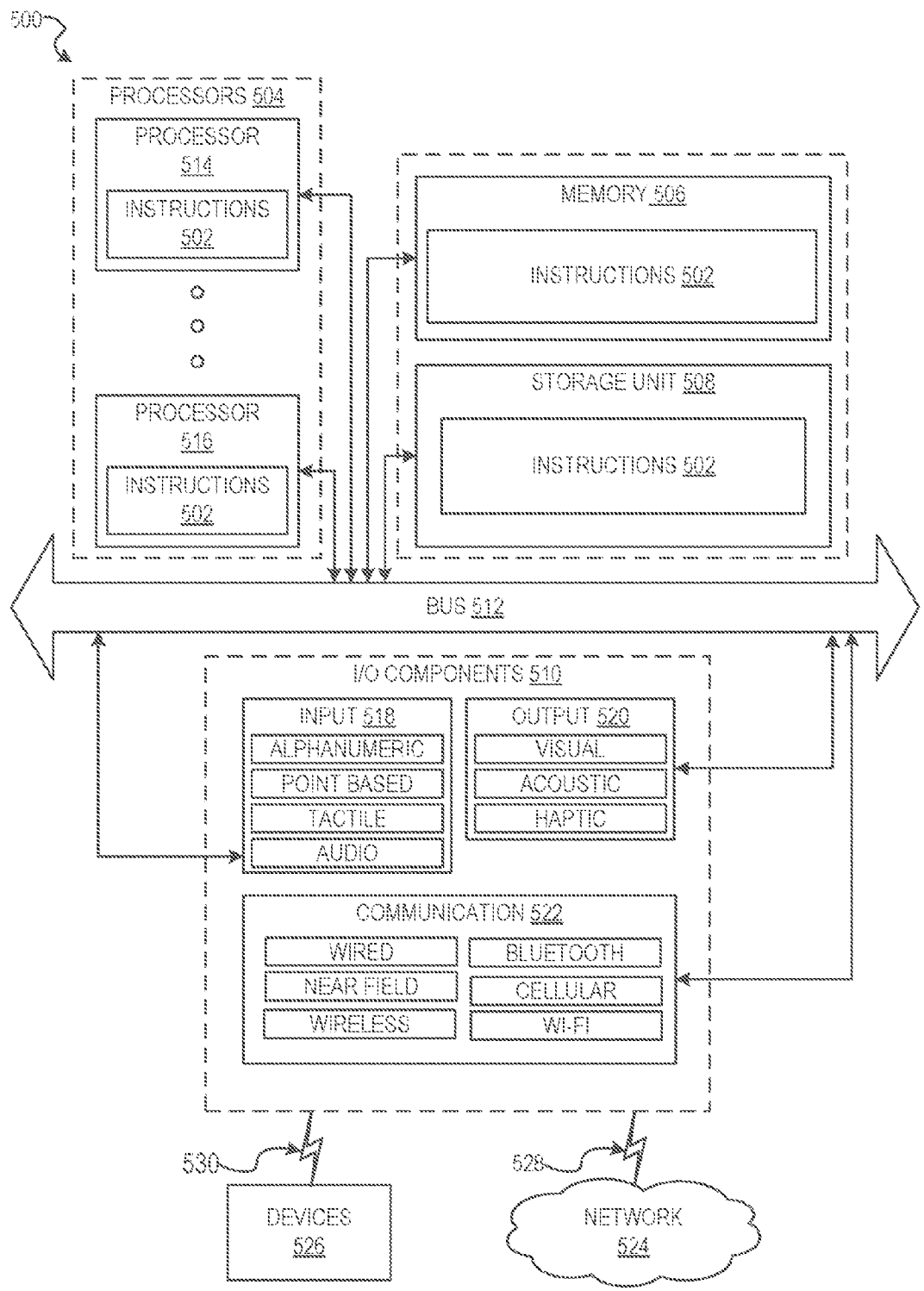
FIG. 5 is a block diagram illustrating components of a machine, according to some example embodiments.

FIG. 5 is a block diagram illustrating components of a machine 500, according to some example embodiments. The machine 500 may be able to read instructions from a machine-readable medium (e.g., a machine-readable storage medium) and perform any one or more of the methodologies discussed herein. Specifically, FIG. 5 shows a diagrammatic representation of the machine 500 in the example form of a system, within which instructions 502 (e.g., software, a program, an application, an applet, an app, a driver, or other executable code) for causing the machine 500 to perform any one or more of the methodologies discussed herein may be executed. For example, the instructions 502 include executable code that causes the machine 500 to execute the method 400. In this way, these instructions 502 transform the general, non-programmed machine 500 into a particular machine programmed to carry out the described and illustrated method 400 in the manner described herein. The machine 500 may operate as a standalone device or may be coupled (e.g., networked) to other machines.

By way of non-limiting example, the machine 500 may comprise or correspond to a television, a computer (e.g., a server computer, a client computer, a personal computer (PC), a tablet computer, a laptop computer, or a netbook), a set-top box (STB), a personal digital assistant (PDA), an entertainment media system (e.g., an audio/video receiver), a cellular telephone, a smart phone, a mobile device, a wearable device (e.g., a smart watch), a portable media player, or any machine capable of executing the instructions 502, sequentially or otherwise, that specify actions to be taken by the machine 500. Further, while only a single machine 500 is illustrated, the term "machine" shall also be taken to include a collection of machines 500 that individually or jointly execute the instructions 502 to perform any one or more of the methodologies discussed herein.

The machine 500 may include processors 504, memory 506, a storage unit 508, and I/O components 510, which may be configured to communicate with each other such as via a bus 512. In an example embodiment, the processors 504 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 514 and a processor 516 that may execute the instructions 502. The term "processor" is intended to include multi-core processors 504 that may comprise two or more independent processors 514, 516 (sometimes referred to as "cores") that may execute instructions 502 contemporaneously. Although FIG. 5 shows multiple processors 504, the machine 500 may include a single processor 514 with a single core, a single processor 514 with multiple cores (e.g., a multi-core processor), multiple processors 514, 516 with a single core, multiple processors 514, 516 with multiple cores, or any combination thereof.

The memory 506 (e.g., a main memory or other memory storage) and the storage unit 508 are both accessible to the processors 504 such as via the bus 512. The memory 506 and the storage unit 508 store the instructions 502, embodying any one or more of the methodologies or functions described herein. The instructions 502 may also reside, completely or partially, within the memory 506, within the storage unit 508, within at least one of the processors 504 (e.g., within the processor's cache memory), or any suitable combination thereof, during execution thereof by the machine 500. Accordingly, the memory 506, the storage unit 508, and the memory of the processors 504 are examples of machine-readable media.

As used herein, "machine-readable medium" means a device able to store instructions 502 and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 502. The term "machine-readable medium" shall also be taken to include any medium, or combination of multiple media, that is capable of storing instructions (e.g., instructions 502) for execution by a machine (e.g., machine 500), such that the instructions 502, when executed by one or more processors of the machine 500 (e.g., processors 504), cause the machine 500 to perform any one or more of the methodologies described herein (e.g., method 400). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 510 may include a wide variety of components to receive input, provide output, produce output, transmit information, exchange information, capture measurements, and so on. The specific I/O components 510 that are included in a particular machine 500 will depend on the type of the machine 500. For example, portable machines such as mobile phones will likely include a touch input device or other such input mechanisms, while a headless server machine will likely not include such a touch input device. It will be appreciated that the I/O components 510 may include many other components that are not specifically shown in FIG. 5. The I/O components 510 are grouped according to functionality merely for simplifying the following discussion and the grouping is in no way limiting. In various example embodiments, the I/O components 510 may include input components 518 and output components 520. The input components 518 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 520 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 510 may include communication components 522 operable to couple the machine 500 to a network 524 or devices 526 via a coupling 528 and a coupling 530 respectively. For example, the communication components 522 may include a network interface component or another suitable device to interface with the network 524. In further examples, the communication components 522 may include wired communication components, wireless communication components, cellular communication components, near field communication (NFC) components, Bluetooth® components (e.g., Bluetooth® Low Energy), WiFi® components, and other communication components to provide communication via other modalities. The devices 526 may be another machine or any of a wide variety of peripheral devices.

The machine 500 may include embodiments of the memory driver circuit 100 to drive the memory 506. For example, the processors 504 may include embodiments of the memory driver circuit 100 to drive the memory 506 via the bus 512. Other components of the machine 500 may also include embodiment of the memory driver circuit 100 to drive the memory 506.

MODULES, COMPONENTS AND LOGIC

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors 504) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor 514 configured using software, the general-purpose processor 514 may be configured as respective different hardware modules at different times. Software may accordingly configure a processor 514, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors 504 that are temporarily configured (e.g., by software) or permanently configured to perform the relevant operations. Whether temporarily or permanently configured, such processors 504 may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors 504 or processor-implemented modules. The performance of certain of the operations may be distributed among the one or more processors 504, not only residing within a single machine 500, but deployed across a number of machines 500. In some example embodiments, the processor or processors 504 may be located in a single location (e.g., within a home environment, an office environment, or a server farm), while in other embodiments the processors 504 may be distributed across a number of locations.

The one or more processors 504 may also operate to support performance of the relevant operations in a "cloud computing" environment or as a "software as a service" (SaaS). For example, at least some of the operations may be performed by a group of computers (as examples of machines 500 including processors 504), with these operations being accessible via a network 524 (e.g., the Internet) and via one or more appropriate interfaces (e.g., APIs).

ELECTRONIC APPARATUS AND SYSTEM

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor 514, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network 524.

In example embodiments, operations may be performed by one or more programmable processors 504 executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network 524. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor 514), or in a combination of permanently and temporarily configured hardware may be a design choice.

Figure 6:
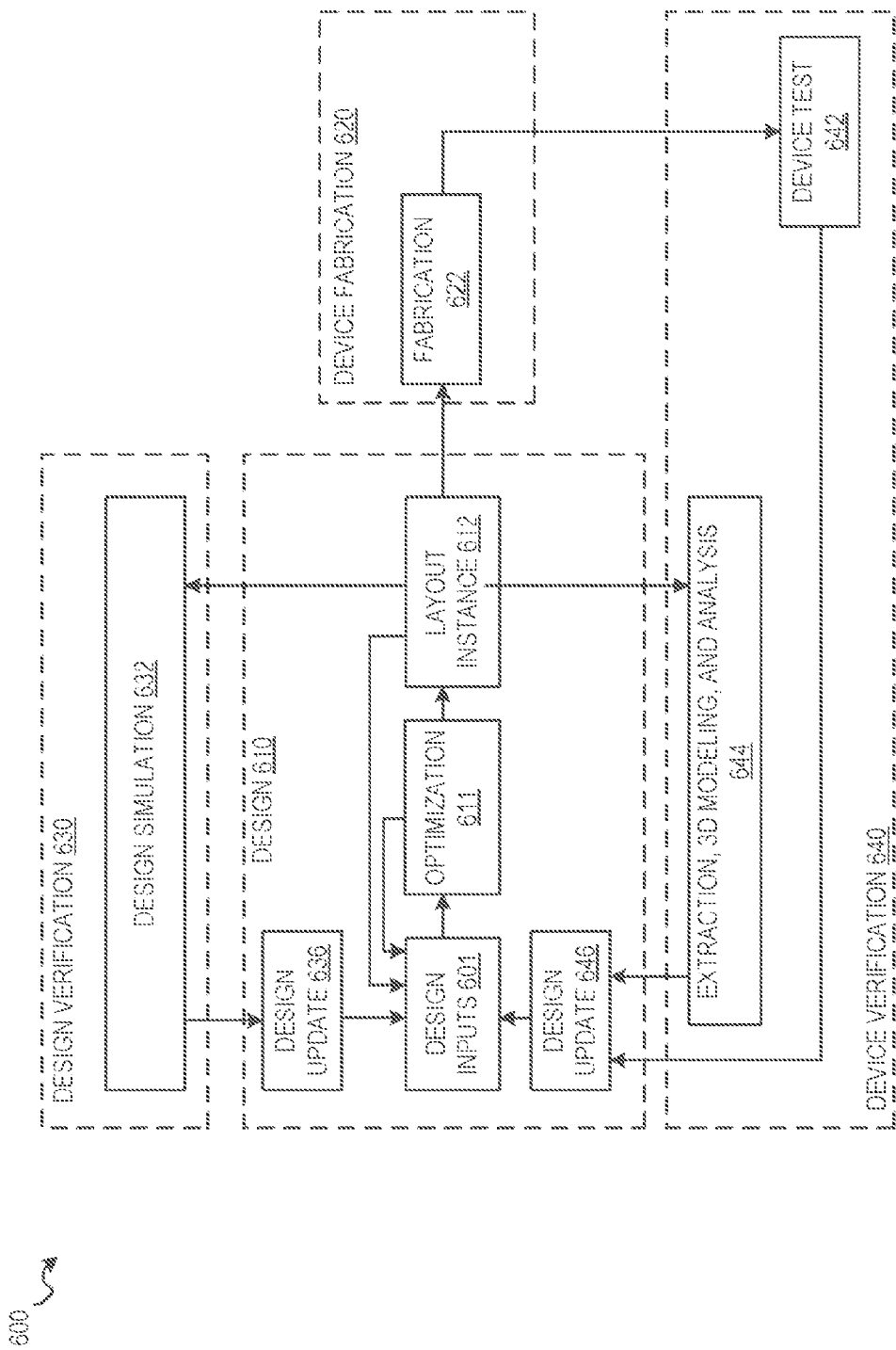
FIG. 6 is a diagram illustrating one possible design process flow for generating a circuit, according to some example embodiments.

FIG. 6 is a diagram illustrating one possible design process flow 600 for generating a circuit, according to some example embodiments. The generated circuit may include one or more embodiments of circuits disclosed herein, and may integrate with a larger integrated circuit comprising different design blocks. As illustrated, the overall design process flow 600 includes a design phase 610, a device fabrication phase 620, a design verification phase 630, and a device verification phase 640. The design phase 610 involves an initial design input operation 601 where the basic elements and functionality of a device are determined, as well as revisions based on various analyses and optimization of a circuit design. This design input operation 601 is where instances of an EDA circuit design file are used in the design and any additional circuitry is selected. The initial strategy, tactics, and context for the device to be created are also generated in the design input operation 601, depending on the particular design algorithm to be used.

In some embodiments, following an initial selection of design values in the design input operation 601, timing analysis and optimization to various embodiments occurs in an optimization operation 611, along with any other automated design processes. One such process may be the automated design of an embodiment of a circuit as disclosed herein. As described below, design constraints for blocks of a circuit design generated with design inputs in the design input operation 601 may be analyzed using hierarchical timing analysis, according to various embodiments. While the design process flow 600 shows such optimization occurring prior to a layout instance 612, such hierarchical timing analysis and optimization may be performed at any time to verify operation of a circuit design. For example, in various embodiments, constraints for blocks in a circuit design may be generated prior to routing of connections in the circuit design after routing, during register transfer level (RTL) operations, or as part of a final signoff optimization or verification prior to a device fabrication operation 622.

After design inputs are used in the design input operation 601 to generate a circuit layout, and any optimization operations 611 are performed, a layout is generated in the layout instance 612. The layout describes the physical layout dimensions of the device that match the design inputs. This layout may then be used in the device fabrication operation 622 to generate a device, or additional testing and design updates may be performed using designer inputs or automated updates based on design simulation 632 operations or extraction, 3D modeling and analysis 644 operations. Once the device is generated, the device can be tested as part of device test 642 operations, and layout modifications generated based on actual device performance.

As described in more detail below, design updates 636 from the design simulation 632, design updates 646 from the device test 642 or the 3D modeling and analysis 644 operations, or the design input operation 601 may occur after an initial layout instance 612 is generated. In various embodiments, whenever design inputs are used to update or change an aspect of a circuit design, a timing analysis and optimization operation 611 may be performed.

For example, in various embodiments, a user may provide an input to a computing device indicating placement of elements of a circuit within a first portion of a circuit design, including a description of embodiments of circuitry as disclosed herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A computer memory driver circuit comprising:
thin-oxide PMOS transistor, a thick-oxide PMOS transistor, a thick-oxide NMOS transistor, and a thin-oxide NMOS transistor having channels coupled in order from a first high voltage rail to a low voltage rail, the coupling between the thick-oxide PMOS transistor and the thick-oxide NMOS transistor at an output node to drive a computer memory circuit;
a flying capacitor circuit having an input to receive an input signal and an output coupled with a gate of the thin-oxide PMOS transistor and a gate of the thick-oxide NMOS transistor, the flying capacitor circuit also coupled to the first high voltage rail and a second high voltage rail, the flying capacitor to level-shift the input signal by a difference between a voltage of the first high voltage rail and a voltage of the second high voltage rail; and
a buffer circuit having an input to receive the input signal and an output coupled with a gate of the thick-oxide PMOS transistor and a gate of the thin-oxide NMOS transistor.

2. The computer memory driver circuit of claim 1, wherein the buffer circuit buffers the input signal with a signal delay equivalent to a signal delay of the flying capacitor circuit.

3. The computer memory driver circuit of claim 1; wherein:
the thin-oxide PMOS transistor has a source coupled with the first high voltage rail, the voltage of the first high voltage rail being a first high voltage level;
the thick-oxide PMOS transistor has a source coupled with a drain of the thin-oxide PMOS transistor and a drain coupled with the output node;
the thin-oxide NMOS transistor has a source coupled with the low voltage rail; and
the thick-oxide NMOS transistor has a source coupled with a drain of the thin-oxide NMOS transistor and a drain coupled with the output node.

4. The computer memory driver circuit of claim 1, further comprising an inverter circuit having an output coupled with the inputs of the flying capacitor circuit and the buffer circuit to invert a signal received at an input of the inverter circuit and output an inverted signal to the flying capacitor circuit and the buffer circuit.

5. The computer memory driver circuit of claim 1, further comprising a signal multiplexer circuit having an output coupled with the inputs of the flying capacitor circuit and the buffer circuit to multiplex a plurality of signals received at inputs of the multiplexer circuit and output the multiplexed plurality of signals to the flying capacitor circuit and the buffer circuit.

6. The computer memory driver circuit of claim 1, wherein the thick-oxide PMOS transistor and the thick-oxide NMOS transistor have a gate oxide thickness greater than a gate oxide thickness of the thin-oxide PMOS transistor and the thin-oxide NMOS transistor.

7. A method of driving a computer memory circuit, the method comprising:
applying a voltage from a first high voltage rail to a channel of a thin-oxide PMOS transistor coupled with channels of a thick-oxide PMOS transistor, a thick-oxide NMOS transistor, and a thin-oxide NMOS transistor in order from the first high voltage rail to a low voltage rail, the thin-oxide PMOS transistor also coupled with the first high voltage rail and the thin-oxide NMOS transistor also coupled with the low voltage rail, the coupling between the thick-oxide PMOS transistor and the thick-oxide NMOS transistor to drive a driver circuit output;
responsive to receiving an input signal at an input of a flying capacitor circuit, applying an output voltage from the flying capacitor circuit to a gate of the thin-oxide PMOS transistor and a gate of the thick-oxide NMOS transistor, the flying capacitor circuit also coupled to the first high voltage rail and a second high voltage rail; and
responsive to receiving the input signal at an input of a buffer circuit, applying an output voltage from the buffer circuit to a gate of the thick-oxide PMOS transistor and a gate of the thin-oxide NMOS transistor;
wherein the flying capacitor circuit is configured to level-shift the output voltage applied to the gates of the thin-oxide PMOS transistor and the thick-oxide NMOS transistor relative to the input signal, an amount of the level shift being a difference between a voltage of the first high voltage rail and a voltage of the second high voltage rail.

8. The method of claim 7, further comprising:
lowering the voltage level of the gate of the thick-oxide PMOS transistor and the gate of the thin-oxide NMOS transistor from the voltage level of the second high of the input signal lowering from the voltage level of the second high voltage rail to the voltage level of the low voltage rail.

9. The method of claim 8, further comprising:
lowering the voltage level of the gate of the thin-oxide PMOS transistor and the gate of the thick-oxide NMOS transistor from the voltage level of the first high voltage rail to a voltage level equivalent to the voltage level of the second high voltage rail subtracted from the voltage level of the first high voltage rail in response to a voltage level of the input signal lowering from the voltage level of the second high voltage rail to the voltage level of the low voltage rail, and
raising the voltage level of the output node from the voltage level of the low voltage rail to the voltage level of the first high voltage rail in response to the voltage level of the input signal lowering from the voltage level of the second high voltage rail to the voltage level of the low voltage rail.

10. The method of claim 7, further comprising:
raising a voltage level of the gate of the thick-oxide PMOS transistor and the gate of the thin-oxide NMOS transistor from the voltage level of the low voltage rail to the voltage level of the second high voltage rail in response to a voltage level of the input signal rising from the voltage level of the low voltage rail to the voltage level of the second high voltage rail.

11. The method of claim 10, further comprising:
raising the voltage level of the gate of the thin-oxide PMOS transistor and the gate of the thick-oxide NMOS transistor from a voltage level equivalent to the voltage level of the second high voltage rail subtracted from the voltage level of the first high voltage rail to the voltage level of the first high voltage rail in response to the voltage level of the input signal rising from the voltage level of the low voltage rail to the voltage level of the second high voltage rail, and lowering the voltage level of the output node from the voltage level of the first high voltage rail to the voltage level of the low voltage rail in response to the voltage level of the input signal rising from the voltage level of the low voltage rail to the voltage level of the second high voltage rail.

12. The method of claim 7, further comprising:

delaying the input signal before outputting the delayed input signal to the gates of the thick-oxide PMOS transistor and the thin-oxide NMOS transistor by the buffer circuit by an amount equivalent to a signal delay of the flying capacitor circuit between the input of the flying capacitor circuit and the gates of the thick-oxide NMOS transistor and the thin-oxide PMOS transistor.

13. The method of claim 7, further comprising inverting an inverter input signal and outputting the inverted inverter input signal to the capacitor circuit and the buffer circuit as the input signal by an inverter circuit.

14. The method of claim 7, further comprising multiplexing a plurality of multiplexer input signals and outputting the multiplexed multiplexer input signals to the flying capacitor circuit and the buffer circuit as the input signal by a multiplexer circuit.

15. A non-transitory computer readable medium comprising instructions that, when executed by one or more processors of a computing device, cause the computing device to perform operations comprising:

selecting elements of a flying capacitor circuit to couple with a first high voltage rail having a first high voltage level and a second high voltage rail having a second high voltage level, the flying capacitor circuit to level-shift an input signal received at an input node by a difference between the first high voltage level and the second high voltage level and provide the level-shifted input signal at a flying capacitor circuit output;

selecting elements of a buffer circuit to couple between the input node and a buffer circuit output;

configuring a thin-oxide PMOS transistor to have a source coupled with the first high voltage rail and a gate coupled with the flying capacitor circuit output;

configuring a thick-oxide PMOS transistor to have a source coupled with a drain of the thin-oxide PMOS transistor, a drain coupled with an output node, and a gate coupled with the buffer circuit output;

configuring a thin-oxide NMOS transistor to have a source coupled with the low voltage rail and a gate coupled with the buffer circuit output;

configuring a thick-oxide NMOS transistor to have a source coupled with a drain of the thin-oxide NMOS transistor, a drain coupled with the output node, and a gate coupled with the flying capacitor circuit output; and generating a circuit design file comprising the flying capacitor circuit, the buffer circuit, the thin-oxide PMOS transistor, the thick-oxide PMOS transistor, the thick-oxide NMOS transistor, and the thin-oxide NMOS transistor.

16. The non-transitory computer readable medium of claim 15, further comprising instructions that cause the buffer circuit to delay the input signal by an amount equivalent to a signal delay of the flying capacitor circuit between the input node and the gates of the thick-oxide NMOS transistor and the thin-oxide PMOS transistor.

17. The non-transitory computer readable medium of claim 15, further comprising instructions that cause the computing device to configure an inverter circuit having an output coupled with the input node to invert a signal received at an input of the inverter circuit and output an inverted signal to the input node.

18. The non-transitory computer readable medium of claim 15, further comprising instructions that cause the computing device to configure a signal multiplexer circuit having an output coupled with the input node to multiplex a plurality of signals received at inputs of the multiplexer circuit and output the multiplexed signals to the input node.

19. The non-transitory computer readable medium of claim 15, further comprising instructions that cause the computing device to configure the thick-oxide PMOS transistor and the thick-oxide NMOS transistor to have a gate oxide thickness greater than a gate oxide thickness of the thin-oxide PMOS transistor and the thin-oxide NMOS transistor.

* * * * *